(12) United States Patent
Haran et al.

(10) Patent No.: US 8,629,007 B2
(45) Date of Patent: Jan. 14, 2014

(54) METHOD OF IMPROVING REPLACEMENT METAL GATE FILL

(75) Inventors: Balasubramanian S. Haran, Watervliet, NY (US); James J. Demarest, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 13/182,544

(22) Filed: Jul. 14, 2011

(65) Prior Publication Data
US 2013/0017680 A1    Jan. 17, 2013

(51) Int. Cl.
*H01L 21/84* (2006.01)

(52) U.S. Cl.
USPC .............. 438/151; 257/E21.561; 438/275; 438/287

(58) Field of Classification Search
USPC .............. 438/289–291, 275–278, 287, 151; 257/E21.561
See application file for complete search history.

(56) References Cited

U.S. PATENT DOCUMENTS

| | | | |
|---|---|---|---|
| 5,960,270 A * | 9/1999 | Misra et al. ................ | 438/197 |
| 2005/0148137 A1 | 7/2005 | Brask et al. | |
| 2007/0262451 A1 | 11/2007 | Rachmady et al. | |
| 2010/0065926 A1 | 3/2010 | Yeh et al. | |
| 2010/0237435 A1 | 9/2010 | Chudzik et al. | |
| 2010/0311231 A1 | 12/2010 | Thei et al. | |

* cited by examiner

*Primary Examiner* — Richard Booth
(74) *Attorney, Agent, or Firm* — Catherine Ivers; H. Daniel Schnurmann (57) ABSTRACT

A method of making a gate of a field effect transistor (FET) with improved fill by a replacement gate process using a sacrificial film includes providing a substrate with a dummy gate. It further includes depositing a sacrificial layer and an encapsulating layer over the substrate, and planarizing so that the encapsulating layer, sacrificial layer and dummy gate are co-planar. The encapsulating layer and a portion of the sacrificial film are removed to leave a remaining sacrificial film. The dummy gate is removed to form and opening in the remaining sacrificial film and to expose sidewalls of the film. Spacers are formed on the sidewalls. A high dielectric constant film and metal film are deposited in the opening and planarized to form a gate. The remaining sacrificial film is removed. The method can be used on planar FETs as well non-planar FETs.

12 Claims, 11 Drawing Sheets

METHOD OF IMPROVING REPLACEMENT METAL GATE FILL

FIELD OF THE INVENTION

The present invention generally relates to semiconductors and to a method of manufacturing planar Field Effect Transistors (FETs) or non-planar FETs using a replacement gate process. In particular, the invention relates to an improved method of forming a gate by using a sacrificial film.

BACKGROUND AND RELATED ART

In a typical replacement gate process for manufacturing a FET, a dummy gate is lithographically formed on the substrate, spacers are formed on the sidewalls of the dummy gate, and a dielectric is deposited to cover the gates and fill the areas between gates. The dielectric is then polished or etched back so as to be co-planar with the dummy gate. Then the dummy gate is removed leaving an opening in the dielectric. Within the opening, a gate dielectric is deposited and the remainder of the opening is over-filled with gate material. The structure is then polished so that the gate material in the opening and the dielectric are co-planar. In a typical replacement gate process, the height of the opening, and thus, the opening's aspect ratio, is determined by the dummy gate dimensions. In a typical replacement gate process, voids commonly form in the gate. Voids in the gate are detrimental to device performance.

SUMMARY

In one embodiment, a replacement gate process with improved gate formation is described by way of a method that lowers the aspect ratio of the opening filled by gate material. The method results in void-free gates and minimizes voiding the gate.

In one embodiment, a method of manufacturing a gate in a FET is provided that uses a sacrificial layer in a replacement gate process. The method includes forming a dummy gate, a sacrificial layer and an encapsulating layer above a substrate. Then, a portion of the dummy gate is exposed, typically by chemical mechanical polishing (herein "CMP"). Any remaining portion of the encapsulating layer, the dummy gate, and a portion of the sacrificial layer are removed leaving a remaining portion of the sacrificial layer on the substrate. The method further includes depositing a high dielectric constant film and a metal film and planarizing the substrate so that the metal film, the high dielectric constant film, and the remaining sacrificial layer are co-planar. The remaining sacrificial layer is then removed.

In one embodiment of the invention, a method of forming a gate in a FET includes providing a substrate with an isolation area, an active area and a step height between the isolation area and the active area. A dummy gate is formed above the isolation area and above the active area. Above the substrate and dummy gates, a sacrificial layer and an encapsulating layer are deposited. A portion of the dummy gate is exposed, typically by CMP. Then the encapsulating layer, the dummy gates, and a portion of the sacrificial layer are removed to leave a remaining portion of the sacrificial layer. A high dielectric constant film and a metal film are deposited and then planarized so that the metal film, the high dielectric constant film, and the remaining sacrificial layer are co-planar to form a first gate over the isolation area and a second gate over the active area. The remaining sacrificial layer is removed.

Embodiments of the present invention have p-doped FET (pFET) threshold voltages remain within specification without sacrificing effective oxide thickness, and lowers the aspect ratio opening to be filled.

In another aspect, planarity is achieved over both the isolation and active areas of the device despite existing, underlying topography (the step height).

Embodiments of the present invention apply to planar and non-planar FETs.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below serve to explain the principles of embodiments of the invention.

DETAILED DESCRIPTION

In an embodiment of the invention, a method of improved gate formation is applied to a planar FET and is described in conjunction with FIGS. 1-8. A planar FET is an FET in which the current flow is in the same plane as the substrate. Thus, in a planar FET, typically the source, channel and drain are in the same plane with the gate sitting atop the channel. In addition, the method for improved of gate formation is applied to a non-planar FET (i.e., finFET or Trigate transistor) and is described in conjunction with FIGS. 9-17. A non-planar FET is a device which includes a fin protruding out of the wafer (substrate) plane and a gate wrapped around the three sides of the protruding fin. The current flows vertically along the sides of the fin (perpendicular to the plane of the substrate), thus the current flow is out of plane (non-planar). A detailed description of the invention is made in combination with the following embodiments.

Planar Fet

Figure 1:
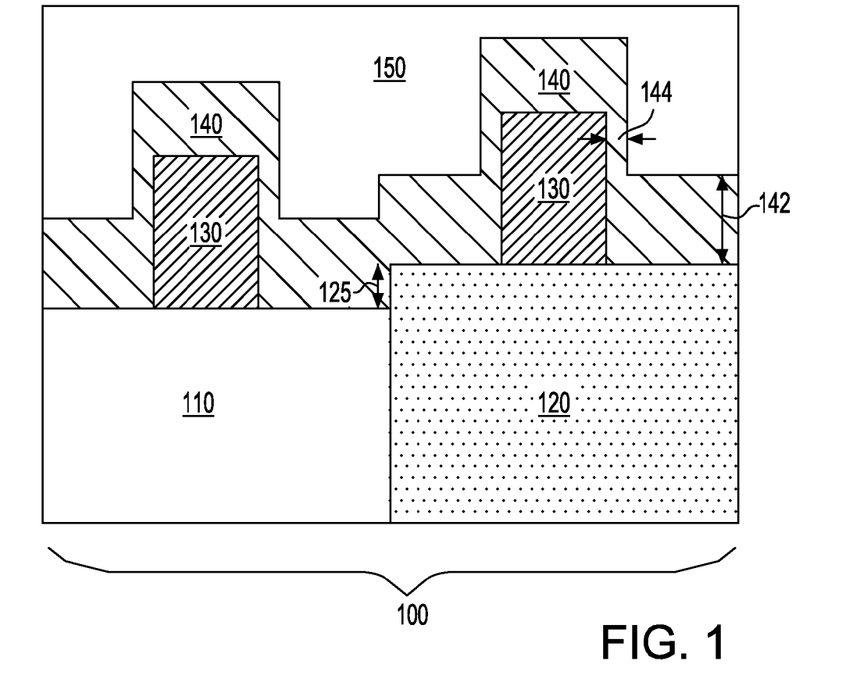
FIG. 1 illustrates a substrate having an isolation area, an active area, dummy gates, a sacrificial layer and an encapsulating layer according to an embodiment of the invention.

FIG. 1 shows an embodiment of the invention in which a substrate 100 with an isolation region 110 and an active area region 120 is provided. The isolation region 110 is one or more insulating films and in a preferred embodiment is silicon dioxide. The active area 120 of the substrate is a semiconductor material and can be silicon, silicon doped with conventional n-dopants or p-dopants, silicon germanium (SiGe), silicon germanium carbon (SiGeC), silicon carbon (SiC), III-V semiconductor compounds (for example $In_{1-x}Ga_xAs$, InP, GaAs) or other variations.

Not shown in FIG. 1, but present are a doped source/drain region and an extension region in the active area 120 of the substrate 100. Dopant species commonly include B or $BF_2$ for p-type doping and As or P for n-type doping, though other species are possible. Shown therein, is a substrate 100 provided with isolation area 110 and active area 120 with a height difference between the isolation and active areas; the difference thereof being referenced as step height 125. The step height can range from about 1 nm to about 25 nm.

Still referring to FIG. 1, a dummy gate 130 is formed over isolation 110 and active 120 areas of the substrate. The dummy gate 130 is formed by standard deposition and lithography techniques. The length of the dummy gate ranges from 12 nm to 480 nm, and preferably from about 10 nm to approximately 100 nm. The dummy gate can be made using any material or combination thereof that enables a good chemical mechanical polish (herein "CMP") stop layer, and which can be selectively removed by wet etch. In one embodiment, the dummy gate is preferably a silicon nitride film, but other silicon or nitrogen containing films can also be used that meet the above established integration criteria.

The method also includes depositing a conformal sacrificial layer 140, although not uniformly, over substrate 100 and dummy gates 130. The deposition and resulting sacrificial layer 140 is non-uniform because a first thickness 142 of the sacrificial film (thickness on horizontal surfaces) is greater than a second thickness 144 of the sacrificial film (thickness on vertical surfaces) as shown in FIG. 1. In a preferred embodiment, the sacrificial film 140 is made of diamond like carbon. The sacrificial film 140 can also be made of amorphous carbon (herein after "a-Carbon"). Likewise, other films that can be easily removed using an ash process ($O_2$ plasma) are possible sacrificial film candidates. The first thickness 142 of the sacrificial film 140 should be greater than the step height 125 between the isolation 110 and active 120 areas. The first thickness 142 of the sacrificial film 140 preferably ranges from about 1.5 to about 8 times greater than the step height 125. In a preferred embodiment the first thickness 142 of the sacrificial film 140 is twice greater than the step height 125. In a preferred embodiment, the first thickness 142 is about 10 nm to about 50 nm, but can be as high as 200 nm, and ranges therebetween. The second thickness 144 ranges from about 2 nm to about 30 nm. The sacrificial film 140 can be deposited using a variety of methods that include, but are not limited to, chemical vapor deposition, plasma enhanced chemical vapor deposition, atomic layer deposition, physical vapor deposition, and spin-on.

The method also includes depositing an encapsulating layer 150 shown in FIG. 1. As the name suggests, the encapsulating layer preferably is deposited to a thickness sufficient to encapsulate the dummy gates 130 and fill there between. The encapsulating layer 150 thickness can vary from about 50 nm to 200 nm as deposited, including ranges therebetween. The encapsulating layer 150 is an oxygen-containing film, preferably, silicon dioxide, but other oxides or other insulating films are acceptable. Furthermore, any other film that can be removed selectively with respect to the sacrificial film 140 and dummy gate 130 can be used as the encapsulating layer 150. The encapsulating layer 150 can be deposited by chemical vapor deposition, plasma enhanced chemical vapor deposition, or spin on.

Figure 2:
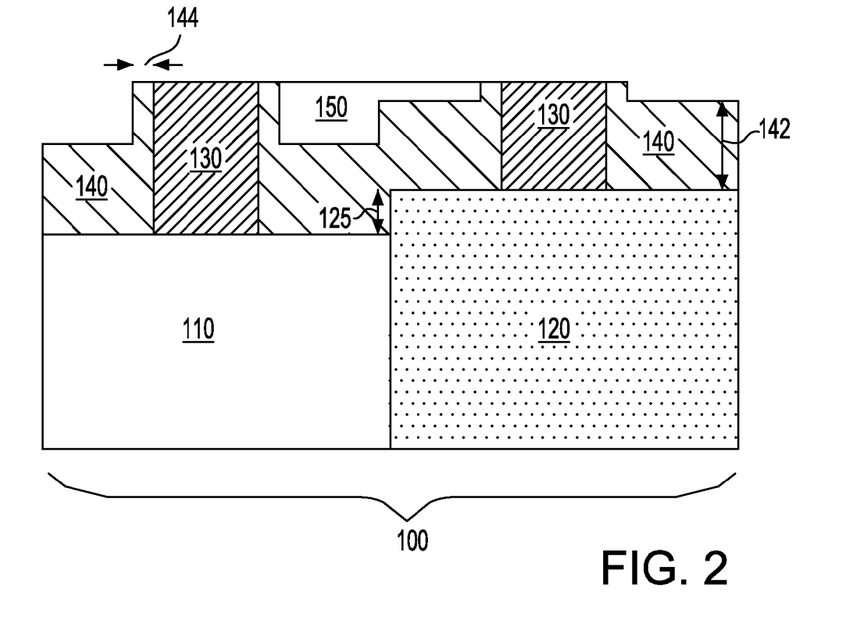
FIG. 2 illustrates a substrate with dummy gates after planarization according to an embodiment of the invention.

Referring to FIG. 2, the method includes polishing (CMP) or etching the substrate 100 so that the encapsulating layer 150, at least one dummy gate 130, and the sacrificial film 140 are co-planar, leaving the dummy gate 130 exposed.

Figure 3:
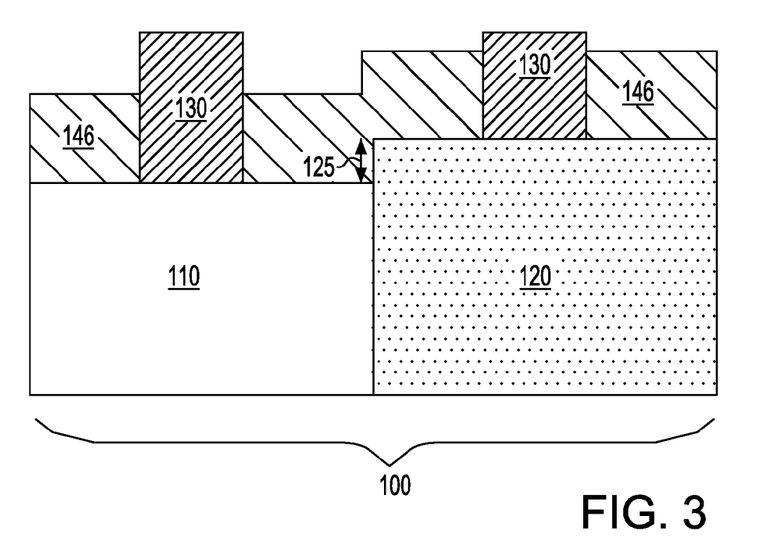
FIG. 3 illustrates a substrate after an encapsulating layer and a portion of the sacrificial layer are removed according to an embodiment of the invention.

Referring to FIG. 3, after CMP (or etch), any remaining encapsulating layer 150 is removed by wet or dry etch selective to the dummy gate 130 and sacrificial layer 140. In addition, the sacrificial layer 140 is etched by reactive ion etching (herein "RIE") so that the sacrificial layer 140 on the is removed from the sidewalls of the dummy gate 130 while a remaining portion 146 of the sacrificial layer is left over the substrate. Alternatively, the second thickness 144 of the sacrificial layer 140 is removed to keep a remaining portion 146 of the sacrificial layer.

Figure 4:
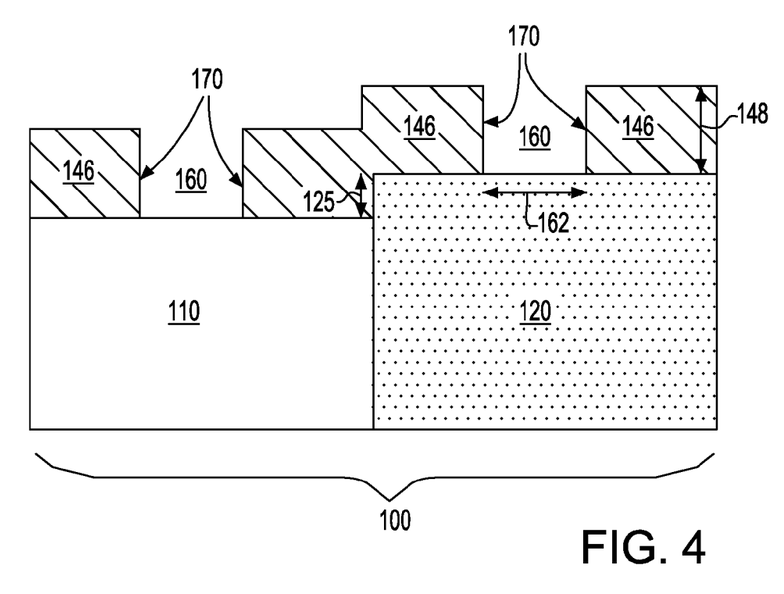
FIG. 4 illustrates an opening after the dummy gate is removed according to an embodiment of the invention.

Referring to FIG. 4, the method includes removing the dummy gate 130 by RIE to leave dummy gate openings 160 each having a width 162. Removing the dummy gate exposes sidewalls 170 of the remaining portion 146 of the sacrificial layer. The height 148 of the remaining portion 146 of the sacrificial layer is also illustrated in FIG. 4. The height 148 of the remaining portion 146 of sacrificial layer versus the width 162 of the dummy gate opening 160 defines the aspect ratio of the dummy gate opening. The aspect ratio of the dummy gate opening can be less than about 2:1; is preferably less than about 1.5:1; even more preferably less than about 1:1; and even be less than about 1:2. It should be noted that in the planar FET embodiment, the height of the dummy gate opening is determined by the height 148 of the remaining portion 146 of the sacrificial film. Thus, the height of the dummy gate opening is the same whether the opening 160 is over the isolation area 110 of the substrate 100 or over the active area 120. As a result, the dummy gate opening 160 aspect ratio is the same whether the opening 160 is over the isolation area 110 or over the active area 120 of the substrate 100. Thus, all openings have a relatively low aspect ratio and can be filled by a gate in a void free manner.

Figure 5:
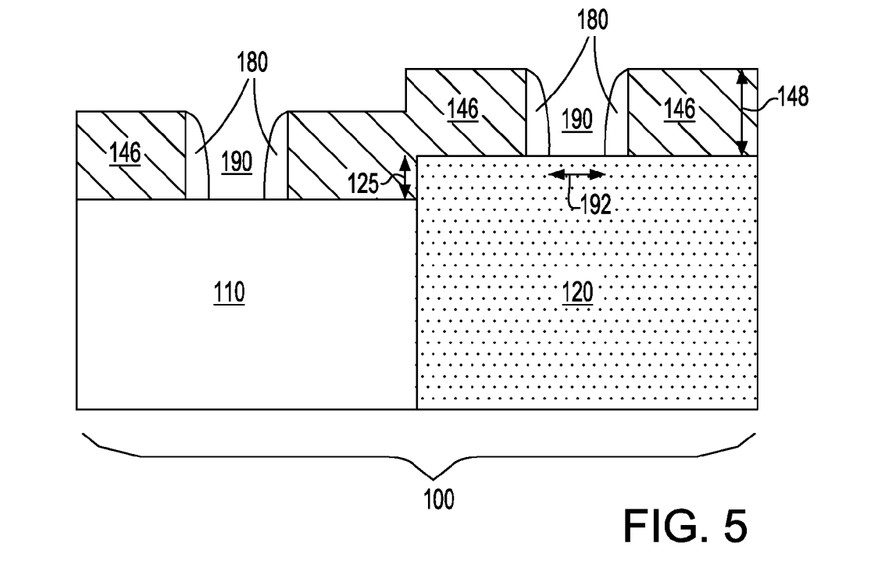
FIG. 5 illustrates spacers on the sacrificial layer according to an embodiment of the invention.

Referring to FIG. 5, the method optionally includes forming spacers 180 adjacent the sidewalls 170 of the remaining portion 146 of the sacrificial film which results in a spacer openings 190 each having a width 192. The height 148 of the remaining portion 146 of the sacrificial layer versus the width 192 of the spacer opening 190 defines the aspect ratio of the spacer opening. The width 192 of the spacer opening 190 preferably varies from about 12 nm to about 26 nm, and as high as 480 nm. The height 148 of the remaining portion 146 of the sacrificial layer and, hence, the height of the spacer opening 190 can vary from about 15 nm to about 40 nm, up to about 100 nm. The aspect ratio of the spacer opening is preferably less than about 2.5:1; is preferably less than about 1.5:1; even more preferably is less than about 1:1; and can even be less than about 1:2. The spacers 180 are made of oxide, a nitride, or a carbide film, but are preferably a silicon nitride film. The spacers can be deposited by plasma enhanced chemical vapor deposition or atomic layer deposition and etched by an anisotropic RIE, preferably with fluorine-based chemistries containing one or more of: $CH_2F_2$, $CHF_3$, and $CF_4$. The width of the spacer 180 at is widest point (i.e., the base where the spacer 180 is near the substrate 100) can be from about 2 nm to about 14 nm and ranges therebetween.

It should be noted that the height of the spacer opening is determined by the height 148 of the remaining portion 146 of the sacrificial film. Thus, the height of the spacer opening is the same whether the opening 190 is over the isolation area 110 of the substrate 100 or over the active area 120. As a result, the spacer opening 190 aspect ratio is the same whether the opening 190 is over the isolation area 110 or over the active area 120 of the substrate 100. All spacer openings have a relatively low aspect ratio described above and can be filled (FIG. 6) in a void free environment.

Figure 6:
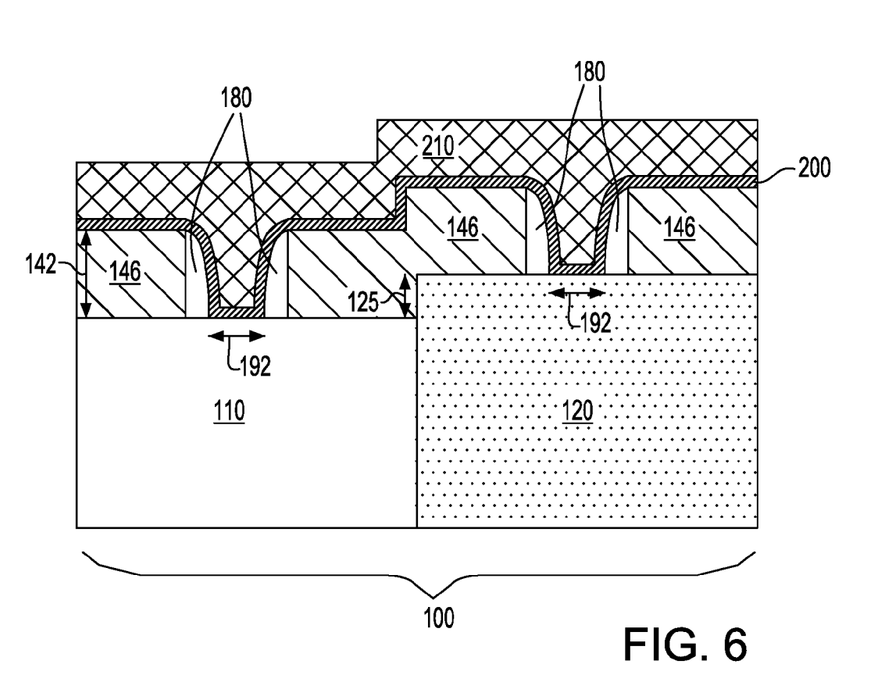
FIG. 6 illustrates a high dielectric constant material, metal deposited in an opening of the sacrificial layer having spacers according to an embodiment of the invention.

Referring to FIG. 6, the spacer opening 190 is lined by a high dielectric constant material 200 (herein referred to as "high-k material") and filled with metal 210. Examples of high-k materials include, but are not limited to, metal oxides such as hafnium oxide (preferred), hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum and aluminum. The high-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metalorganic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of the methods previously mentioned. Preferably the deposition method is ALD. The high-k material thickness can range from about 0.5 nm to 3 nm.

Suitable materials for metal 210 include but are not limited to doped polycrystalline or amorphous silicon; germanium; silicon germanium; metals such as tungsten, titanium, tantalum, ruthenium, zirconium, cobalt, copper, aluminum, lead, platinum, tin, silver, gold; conducting metallic compound materials such as tantalum nitride, titanium nitride, tungsten silicide, tungsten nitride, ruthenium oxide, cobalt silicide, nickel silicide; carbon nanotube; conductive carbon; or any suitable combination thereof. The conducting metallic compound material can further include dopants incorporated during or following deposition. Preferably, the metal 210 is TiN, TaN or TiAl. Suitable processes described above for the high-k material deposition can be used for forming the metal 210. Metal 210 is deposited, overfilling the spacer opening 190 (or dummy gate opening 160 in an embodiment of the method that does not include optional spacers 180). Polishing is performed following the deposition of high-k material 200 and metal 210 films.

Figure 7:
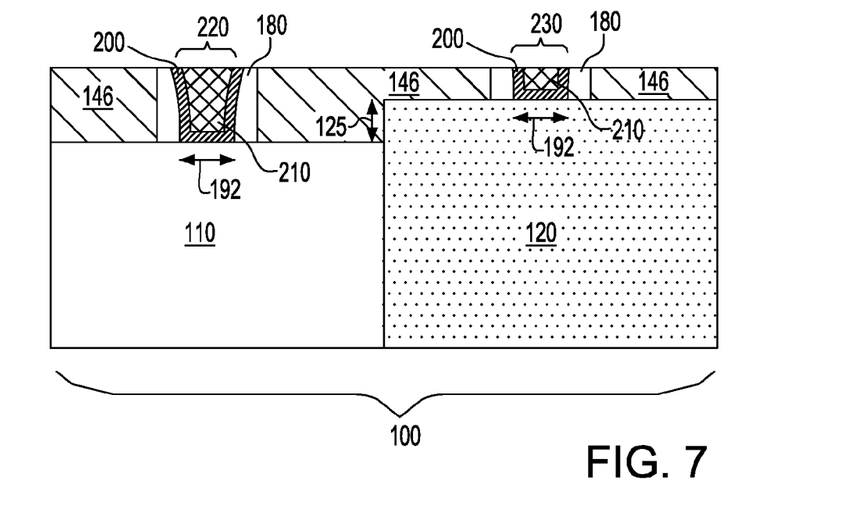
FIG. 7 illustrates a high dielectric constant material metal gate after planarization according to an embodiment of the invention.

Referring to FIG. 7, the high-k material 200 and metal 210 are shown after CMP. The films are polished until the high-k dielectric layer 200; metal layer 210 and; the remaining portion 146 of the sacrificial film become co-planar, forming a first gate 220 over the isolation area 110 of the substrate and a second gate 230 over the active area 120 thereof. Because the second gate 230 is over the active area 120 on the high side of step height 125 of the substrate 100, it becomes co-planar first. Polishing is continued until gate 220 in the isolation region is also formed.

Figure 8:
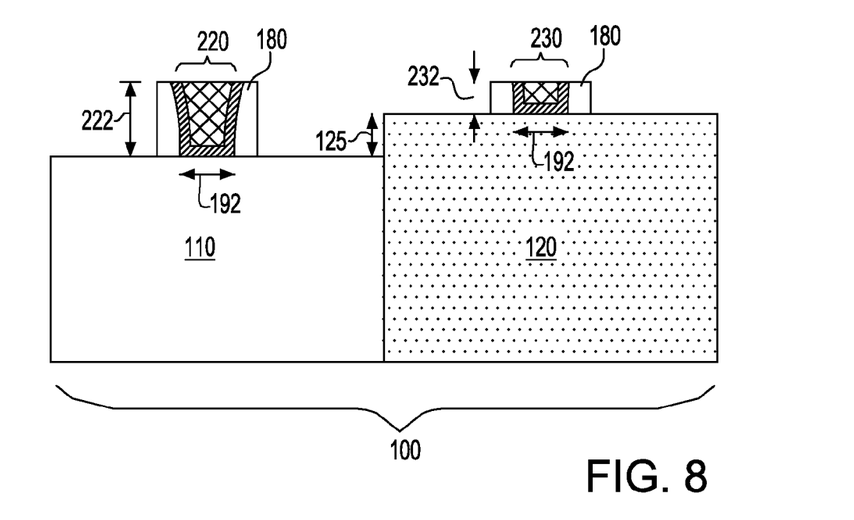
FIG. 8 illustrates a high dielectric constant material metal gate after removal of the remaining sacrificial layer according to an embodiment of the invention.

Referring to FIG. 8, the remaining portion 146 of the sacrificial film is removed by RIE. Referring to gates 220 and 230, the term "gate" includes high-k material 200 and metal 210. The gates, whether first 220 or second 230 have the same width, namely the width 192 of the spacer opening (or width 162 of the dummy gate opening when spacers are not used). The width is measured at the bottom of the gate where the high-k material 200 meets the substrate 100. The width 192 is measured from a first interface of the spacer 180 and high-k material 200 to a second interface of the spacer 180 and high-k material. (In the absence of spacer 180, the width 162 is measured from the outside edges of the high-k material 200). Due to the step height 125 of the substrate 100, the heights of the first gate 220 and second gate 230 are different. The height 222 of the first gate 220 is greater than the height 232 of the second gate 230. The height 222 of the first gate 220 varies from about 11 nm to about 125, and preferably from 18 nm to about 50 nm. The height 232 of the second gate 230 ranges from about 10 nm to about 100 nm, and preferably from 15 nm to about 25 nm.

From this point on, further steps, such as silicidation and contact formation follow. This concludes the description of an embodiment of the method of making a gate in of a FET with a replacement gate process resulting in void free metal gates.

Non-Planar Fets

Figure 9:
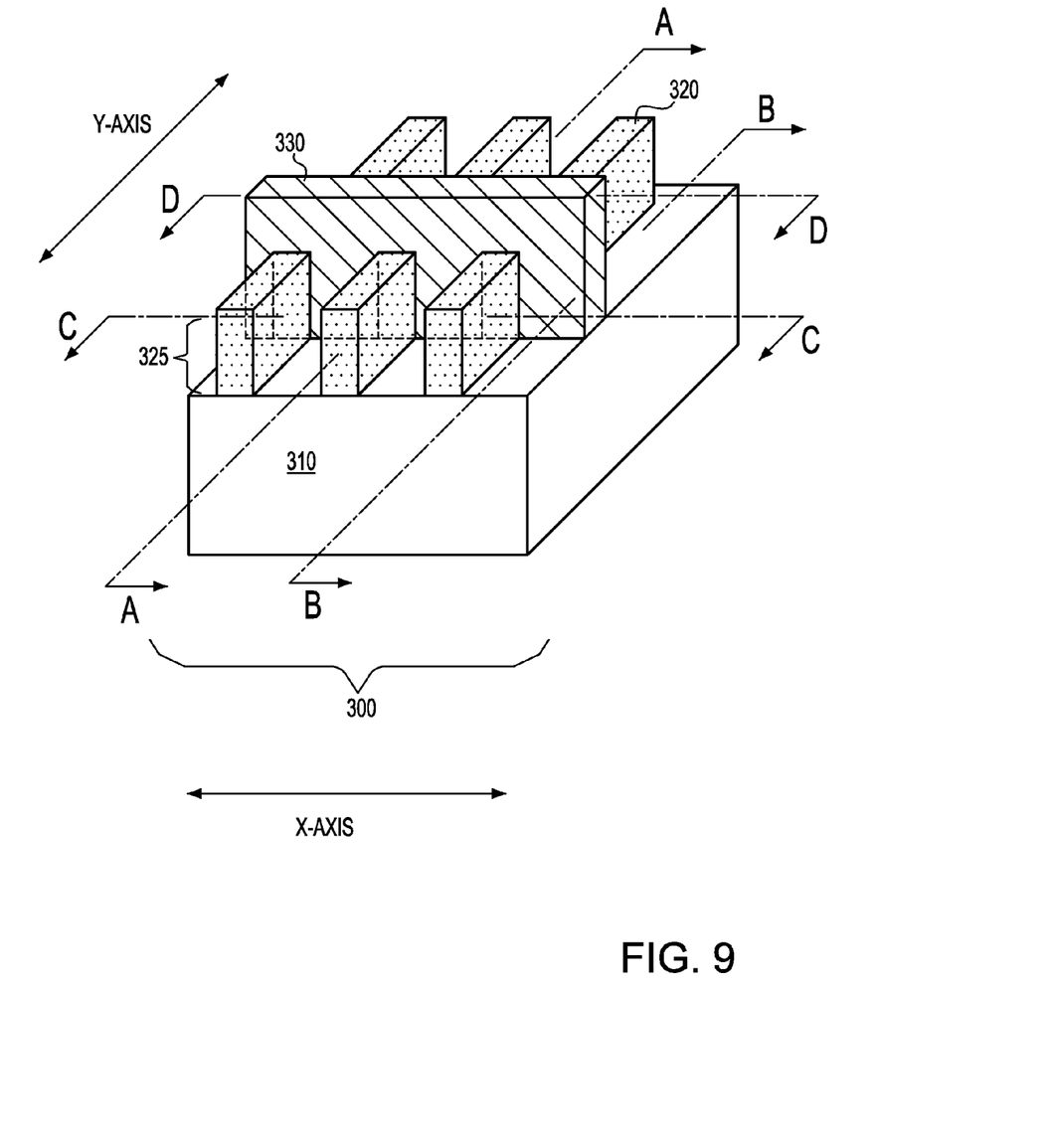
FIG. 9 illustrates a starting point of a method according to an embodiment of the invention in which a substrate with fins and a dummy gate is provided. Lines labeled A, B, C, and D represent cross sections along the x-axis (C and D) and along the y-axis (A and B) which are further illustrated in other figures.

Referring to FIG. 9, an embodiment of the method applied to a non-planar device is shown. In particular, a finFET on a semiconductor on insulator 300 (SOI substrate) is shown. However, a frigate device on a bulk substrate may also be advantageously used, although the substrate is preferably an SOI substrate 300. The isolation area is preferably a buried oxide (BOX 310) of the substrate and the active area a semiconductor layer on top of the BOX. Such semiconductor layer is also referred to a semiconductor on insulator layer (herein "SOI layer"). (It should be noted that other substrates, including but not limited to silicon, GasAs, and the like, can be used. In such a case, the isolation area becomes a trench isolation).

In a finFET embodiment using an SOI substrate, the SOI layer can be patterned to form fins 320, thus making the FET to be non-planar. The height of the fins can range from about 10 nm to about 480 nm and ranges there between, but preferably approximately, 25 nm. The width of the fins varies from about 5 nm to about 40 nm and widths there between, preferably about 10-12 nm. The pitch of the fins can range from about 20 nm to about 150 nm, and preferably about 40 nm. Typically, the insulating layer of the BOX 310 is an oxide, preferably silicon dioxide. The SOI layer 320, which has been etched to form fins 320, can be silicon, silicon doped with conventional n-dopants or p-dopants, silicon germanium (SiGe), silicon germanium carbon (SiGeC), silicon carbon (SiC), III-V semiconductor compounds (for example $In_{1-x}Ga_xAs$, InP, GaAs) or other variations.

Still referring to FIG. 9, dotted lines represent areas wherein cross sections of the FinFET are taken. By way of example, dotted lines "A" and "B" are along the y-axis. More specifically, dotted line "A" is a cross section along the y-axis of the substrate 300, following a fin 220 through the intersection of the fin 320 with the dummy gate 330. Dotted line "B" is also a cross section along the y-axis of the substrate 200, but in an area in which there is only a dummy gate 330. Dotted line "C" is a cross section along the x-axis of the substrate 300 which crosses, perpendicularly, the fins 320. Dotted line "D" also spans along the x-axis of substrate 300, but in an area in which the dummy gate 330 crosses over the fins 320.

Again referring to FIG. 9, the step height 325 is the difference in height between the top of the BOX 210 (isolation area) and the top of the fin 320 (active area). As a result, the step height in a FinFET can be much larger than that in planar devices.

The dummy gate 330 formed over the isolation (BOX) 310 and active (fin) 320 areas of the substrate is illustrated. As shown, the dummy gate can be a "line" of dummy gate material running perpendicular to the fins. The dummy gate 330 can be formed using standard deposition and lithography techniques. The dummy gate width can vary from about 12 nm to about 480 nm. The height of the dummy gate may range from 10 nm to over 100 nm. Preferably, the dummy gate height is to exceed the fins by about 15 nm to 40 nm. In a preferred embodiment, the overall height of the dummy gate ranges from about 50 nm to about 60 nm and exceeds the height of the fins by about 20 nm to 30 nm.

The dummy gate 330 is made from any material or combinations thereof that meet the following integration criteria: firstly, the material(s) can act as a CMP stop layer and secondly, the materials can be removed selectively by wet etch with respect to other materials in the build. In a preferred embodiment, the dummy gate is a silicon nitride film, although other silicon or nitrogen containing films can also be used that meet the above established integration criteria.

Figure 10A:
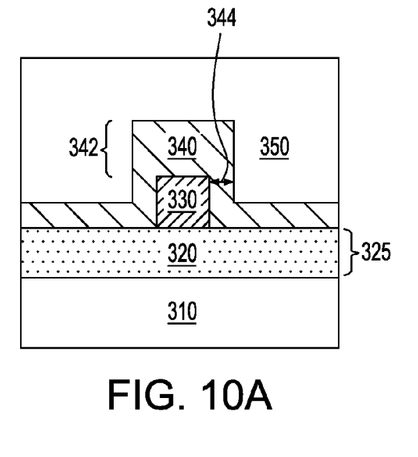
FIG. 10A illustrates a cross section of a substrate having an isolation area (Box), an active area (fins), a dummy gate, a sacrificial layer and an encapsulating layer according to an embodiment of the invention. The cross section is taken along a fin running along the y-axis as the fin goes under the dummy gate (i.e., line "A" of FIG. 9).
Figure 10B:
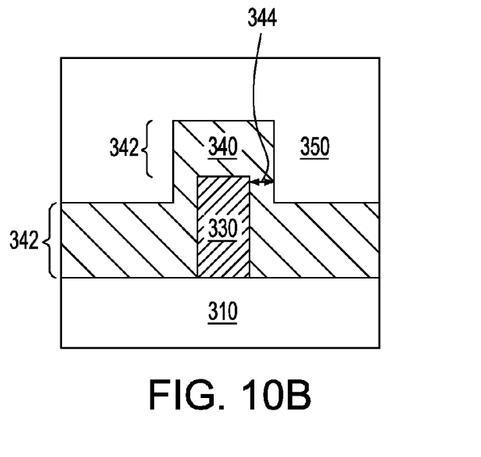
FIG. 10B illustrates a cross section of a substrate having an isolation area (Box), an active area (fins), a dummy gate, a sacrificial layer and an encapsulating layer according to an embodiment of the invention. The cross section is taken along the y-axis in an area in which there is only a dummy gate (i.e., line "B" of FIG. 9).
Figure 10C:
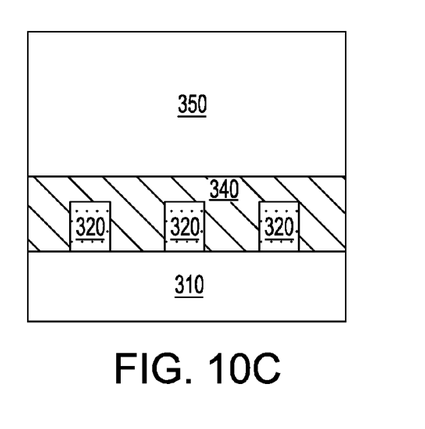
FIG. 10C illustrates a cross section of a substrate having an isolation area (Box), an active area (fins), a dummy gate, a sacrificial layer and an encapsulating layer according to an embodiment of the invention. The cross section is taken along the x-axis in an area in which there are only fins (i.e., line "C" of FIG. 9).
Figure 10D:
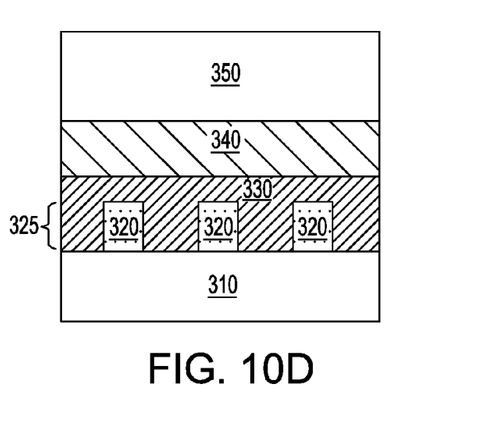
FIG. 10D illustrates a cross section of a substrate having an isolation area (Box), an active area (fins), a dummy gate, a sacrificial layer and an encapsulating layer according to an embodiment of the invention. The cross section is taken along the x-axis along the dummy gate as it crosses over the fins (i.e., line "D" of FIG. 9).

Referring to FIGS. 10A, 10B, 10C and 10D, the method also includes depositing a sacrificial layer 340 over the substrate 300 (box 310 and fin 320) and dummy gate 330. The deposition results in the sacrificial layer 340 filling the spaces between the fins 320 and slightly exceeding the fin height (as illustrated in FIG. 10C). Referring to FIGS. 10A and 10B surrounding the portion of the dummy gate exceeding the height of the fin, the sacrificial layer 340 is conformal, although non-uniform, because a first thickness 342 of the sacrificial film (thickness on horizontal surfaces) is greater than a second thickness 344 of the sacrificial film (thickness on vertical surfaces), as shown in FIGS. 10A and 10B. In a preferred embodiment, the sacrificial film 340 is preferably made of diamond like carbon or amorphous carbon (a-Carbon). Likewise, other films that can be removed easily, e.g., in an ash process ($O_2$ plasma) are potential sacrificial film candidates. The first thickness 342 of the sacrificial film 340 is greater than the step height 325 but less than the dummy gate height, i.e., the thickness of the sacrificial layer in the fin area is such that the sacrificial layer 340 covers the fins, but less than the dummy gate height (see FIGS. 10A, 10B and 10C). In a preferred embodiment, the first thickness 342 of the sacrificial film 340 is 1.5 times greater than the step height 325, with the first thickness 342 exceeding the fin height by about 10 nm to about 20 nm. The second thickness 344 ranges from about 2 nm to 30 nm. The sacrificial film 340 is deposited preferably using a variety of methods that include, but not limited to chemical vapor deposition, plasma enhanced chemical vapor deposition, atomic layer deposition, physical vapor deposition, and spin-on.

Referring back to FIGS. 10A, 10B, 10C and 10D, the method also includes depositing an encapsulating layer 350. As the name suggests, the encapsulating layer is deposited preferably sufficiently thick to encapsulate the dummy gate 330. The encapsulating layer 350 thickness can vary preferably from 50 nm to 200 nm. The encapsulating layer 350 is an oxygen-containing film, preferably, silicon dioxide, but other oxides or other insulating films are acceptable. Furthermore, any other film that can be removed selectively to the sacrificial film 340 and dummy gate 330 can be used. The encapsulating layer 350 can be deposited by chemical vapor deposition, plasma enhanced chemical vapor deposition or spin on.

Figure 11A:
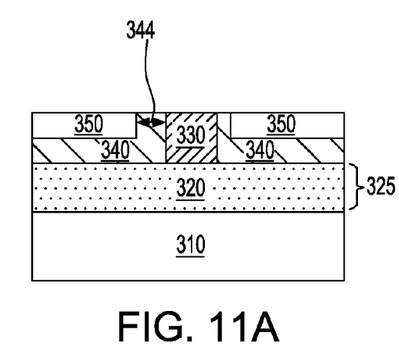
FIG. 11A illustrates a cross section of a substrate from FIG. 10A after planarization according to an embodiment of the invention. The cross section is taken along a fin running along the y-axis as the fin goes under the dummy gate (i.e., line "A" of FIG. 9).
Figure 11B:
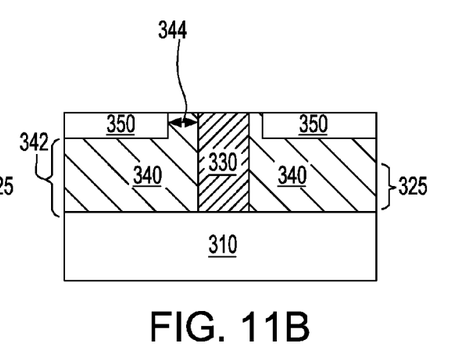
FIG. 11B illustrates a cross section of a substrate from FIG. 10B after planarization according to an embodiment of the invention. The cross section is taken along the y-axis in an area in which there is only a dummy gate (i.e., line "B" of FIG. 9).
Figure 11C:
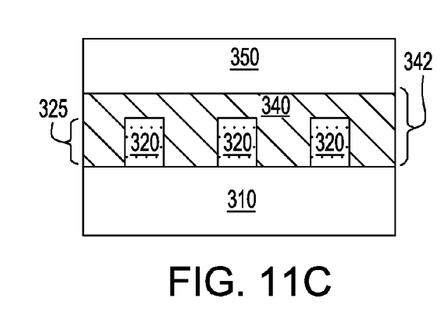
FIG. 11C illustrates a cross section of a substrate of FIG. 10C after planarization according to an embodiment of the invention. The cross section is taken along the x-axis in an area in which there are only fins (i.e., line "C" of FIG. 9).
Figure 11D:
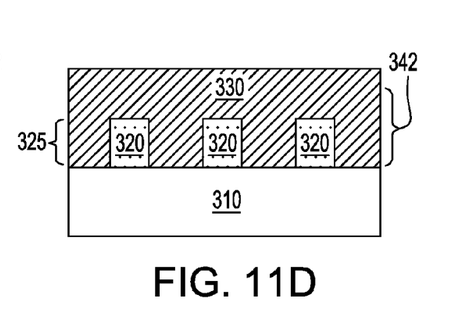
FIG. 11D illustrates a cross section of a substrate of FIG. 10D after planarization according to an embodiment of the invention. The cross section is taken along the x-axis along the dummy gate as it crosses over the fins (i.e., line "D" of FIG. 9).
Figure 12A:
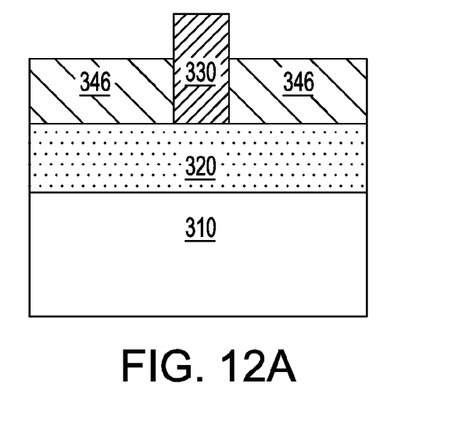
FIG. 12A illustrates a cross section of a substrate with fins after the encapsulating layer and a portion of the sacrificial layer are removed according to an embodiment of the invention. The cross section is taken along a fin running along the y-axis as the fin goes under the dummy gate (i.e., line "A" of FIG. 9).
Figure 12B:
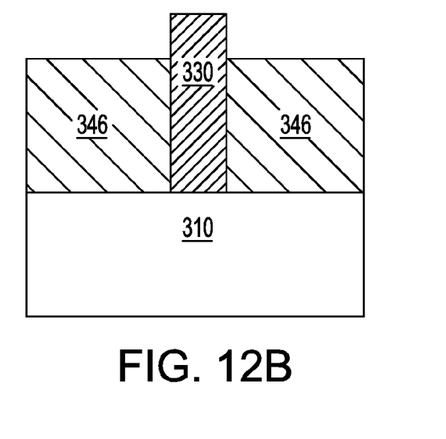
FIG. 12B illustrates a cross section of a substrate with fins after the encapsulating layer and a portion of the sacrificial layer are removed according to an embodiment of the invention. The cross section is taken along the y-axis in an area in which there is only a dummy gate (i.e., line "B" of FIG. 9).
Figure 12C:
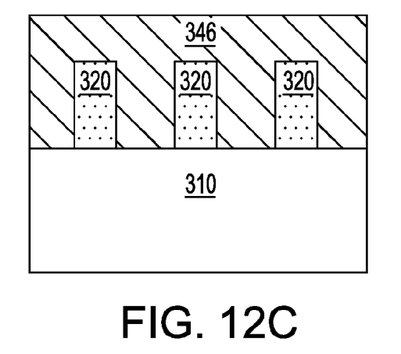
FIG. 12C illustrates a cross section of a substrate with fins after the encapsulating layer and a portion of the sacrificial layer are removed according to an embodiment of the invention. The cross section is taken along the x-axis in an area in which there are only fins (i.e., line "C" of FIG. 9).
Figure 12D:
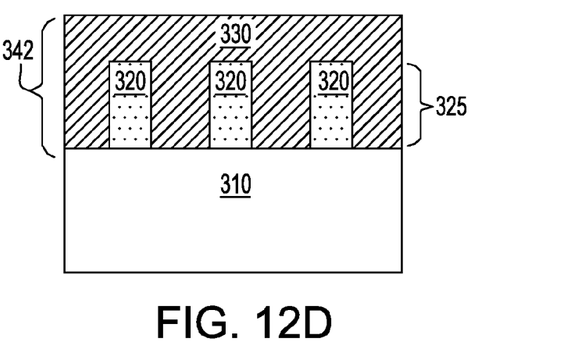
FIG. 12D illustrates a cross section of a substrate with fins after the encapsulating layer and a portion of the sacrificial layer are removed according to an embodiment of the invention. The cross section is taken along the x-axis along the dummy gate as it crosses over the fins (i.e., line "D" of FIG. 9).

Referring to FIGS. 11A, 11B, 11C and 11D, the method includes polishing (CMP) or etching the substrate 300 (BOX 310 and fin 320) so that the encapsulating layer 350, dummy gate 330, and the sacrificial film 340 are co-planar. Thus, the dummy gate 330 is exposed, as can be seen in FIGS. 11A, 11B and 11D.

Referring to FIGS. 12A, 12B, 12C and 12D, after CMP (or etch), any remaining encapsulating layer 350 is removed by wet or dry etch selective to the dummy gate 330 and sacrificial layer 340. In addition, the sacrificial layer 340 is etched by reactive ion etching (RIE) so that the sacrificial layer 340 is removed from the sidewalls of the dummy gate 330 while the remaining portion 346 of the sacrificial layer is left over the substrate (see FIGS. 12A and 12B). Alternatively, the second thickness 344 of the sacrificial layer 340 is removed, leaving a remaining portion 346 of the sacrificial layer.

Figure 13A:
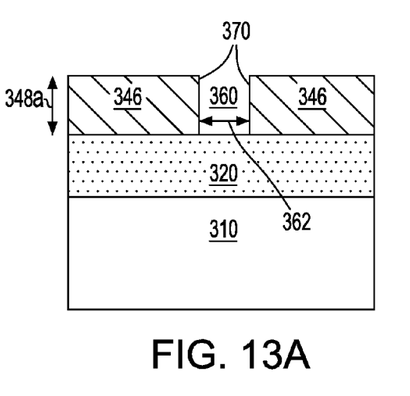
FIG. 13A illustrates a cross section along the y-axis of a substrate with fins after the dummy gate is removed to form and opening according to an embodiment of the invention. The cross section is taken along a fin running along the y-axis as the fin goes under the opening formed by removal of the dummy gate (i.e., line "A" of FIG. 9).
Figure 13B:
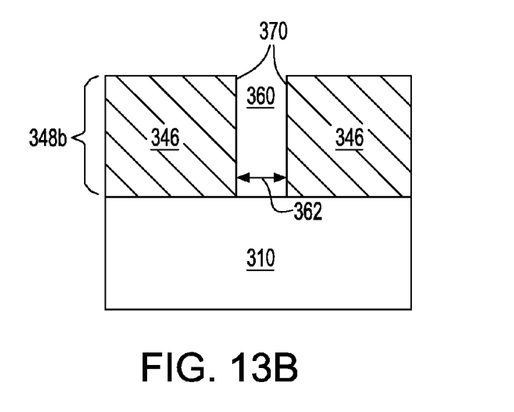
FIG. 13B illustrates a cross section along the y-axis of a substrate with fins after the dummy gate is removed to form and opening according to an embodiment of the invention. The cross section is taken along the y-axis in an area in which there is only the opening formed by removal of the dummy gate (i.e., line "B" of FIG. 9).

Referring to FIGS. 13A and 13B, the method includes removing the dummy gate 330 by RIE, leaving a dummy gate opening 360 having a width 362. Removing the dummy gate exposes the sidewalls 370 of the remaining sacrificial layer 346. The height 348 of the remaining 346 sacrificial layer is also depicted in FIG. 13B as 348b and in FIG. 13A as 348a. The height 348 of the remaining 346 sacrificial layer versus the width 362 of the dummy gate opening 360 defines the aspect ratio of the dummy gate opening. Thus, the height of the dummy gate opening is determined by the height 348 of the remaining sacrificial film 346. Unlike applying the method applicable to a planar FET, when the method is applied to a finFET, the height of the dummy gate opening differs depending upon the location. If the opening 360 spans over the isolation area (Box 310) the height of the opening is 348b. If the opening 360 extends over the active area (fin 320), the height of the opening is 348a. The height over the Box 348b, will be greater than the height over the active area 348a. As a result, the dummy gate opening 360 aspect ratio over the isolation area 310 will be greater than the aspect ratio in the active area 320. Thus, the openings 360 over the active area will have a relatively low aspect ratio, and filled by a gate in a void free environment (see FIG. 13A). Openings 360 in the isolation area 310 are characterized by having a larger aspect ratio than the openings in the active area (FIG. 13D). Although the openings have a lower aspect ratio than that when no sacrificial layer is used, the height 348b of the remaining sacrificial layer 346 is less than the original dummy gate height 330. The aspect ratio of the dummy gate opening 360 over an active area 320 is less than about 2:1; preferably less than about 1.5:1; even more preferably, less than about 1:1; and further, about 1:2. The aspect ratio of the dummy gate opening 360 over an isolation region 310 can be about 8:1, preferably about 2.5:1 and less than about 1:1.

Figure 14A:
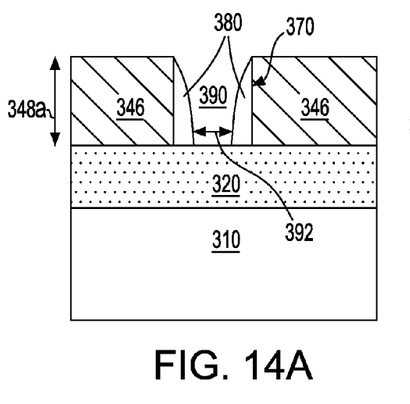
FIG. 14A illustrates a cross section along the y-axis of a substrate with fins and spacers adjacent the sacrificial layer according to an embodiment of the invention. The cross section is taken along a fin running along the y-axis as the fin goes under the opening formed by removal of the dummy gate (i.e., line "A" of FIG. 9).
Figure 14B:
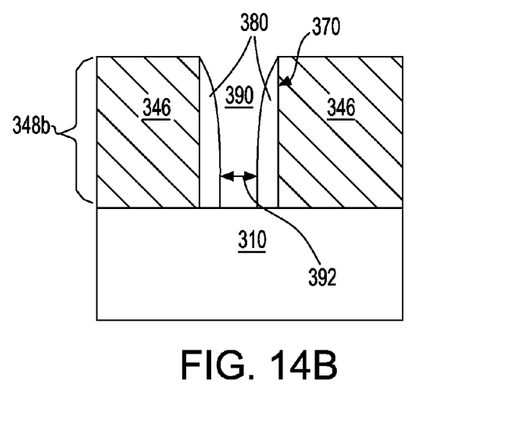
FIG. 14B illustrates a cross section along the y-axis of a substrate with fins and spacers adjacent the sacrificial layer according to an embodiment of the invention. The cross section is taken along the y-axis in an area in which there is only the opening formed by removal of the dummy gate (i.e., line "B" of FIG. 9).

Referring to FIGS. 14A and 14B, the method can include forming spacers 380 on the sidewalls 370 of the remaining 346 sacrificial film, resulting in a spacer opening 390 having a width 392. The height 348 of the remaining 346 sacrificial layer versus the width 392 of the spacer opening 390 defines the aspect ratio of the spacer opening. As previously described in conjunction with the dummy gate opening 360, the height 348 of the spacer opening 390 depends on whether the opening extends over the isolation 310 or the active area 320. The height over the isolation area 348b (FIG. 14B) is greater than over the active area 348a (FIG. 14A). Thus, the aspect ratio of the spacer opening 390 over the isolation area 310 will be greater than the aspect ratio of the spacer opening over the active area 320 (fin). The width 392 of the spacer opening 390 ranges preferably from about 12 nm to about 26 nm, and as high as 480 nm and ranges therebetween. The height 348a of the remaining 346 sacrificial layer over the active area 320 (fin) and, hence, the height 348a of the spacer opening 390 over the active area 320 (fin) varies preferably from about 15 nm to about 40 nm, and up to about 100 nm, including ranges therebetween. The aspect ratio of the spacer opening 390 over the active area 320 (fin) can be less than about 2.5:1; preferably less than about 1.5:1; more preferably is less than about 1:1; and even less than about 1:2. The aspect ratio of the dummy gate opening 360 over an isolation region 310 can be about 8:1, preferably about 2.5:1 and even more preferably less than about 1:1. The spacers 380 can be an oxide, a nitride, or a carbide film, but are preferably a silicon nitride film. The spacers can be deposited by plasma enhanced chemical vapor deposition or atomic layer deposition and etched by an anisotropic RIE, preferably with fluorine-based chemistries containing one or more of: $CH_2F_2$, $CHF_3$, and $CF_4$. The width of the spacer 380 at is widest point (typically the base) can vary from about 2 nm to about 14 nm and ranges therebetween. It should be noted that in this embodiment of the method, the height of the spacer opening is determined by the height 348 of the remaining 346 sacrificial film.

Figure 15A:
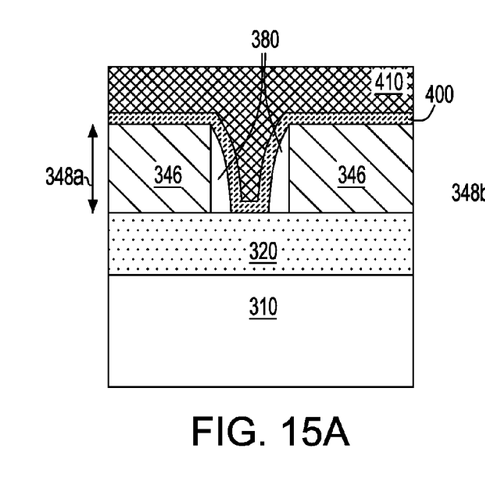
FIG. 15A illustrates a cross section along the y-axis of a substrate with fins, a high dielectric constant material and a metal material filling an opening in a sacrificial layer according to an embodiment of the invention. The cross section is taken along a fin running along the y-axis as the fin goes under the filled opening (i.e., line "A" of FIG. 9).
Figure 15B:
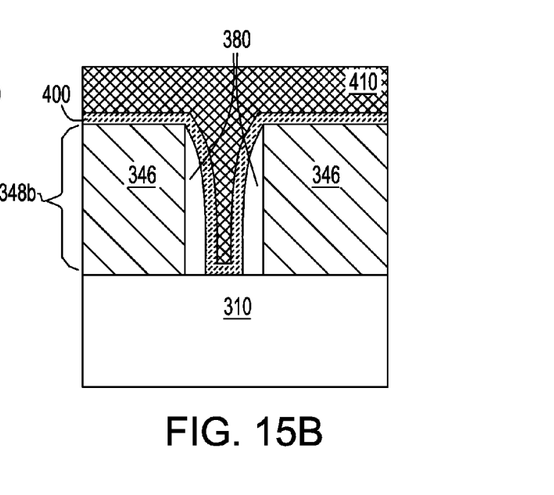
FIG. 15B illustrates a cross section along the y-axis of a substrate with fins, a high dielectric constant material and a metal material filling an opening in a sacrificial layer according to an embodiment of the invention. The cross section is taken along the y-axis in an area in which there is only the filled opening (i.e., line "B" of FIG. 9).

Referring to FIGS. 15A and 15B, the spacer opening 390 is preferably lined by a high dielectric constant material 400 (hereinafter referred to as "high-k material") and filled with metal 410. Examples of high-k materials include, but are not limited to metal oxides such as hafnium oxide (preferred), hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum and aluminum. The high-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metal-organic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of the methods. Preferably the deposition method is ALD. The high-k material thickness can range from about 0.5 nm to 3 nm.

Suitable metal materials 410 can include but not limited to doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of thereof. The conductive material can further include dopants that are incorporated during or after deposition. Preferably, the metal 310 is TiN, TaN or TiAl. Suitable processes described above for high-k material deposition can be used for forming the metal gate. The metal 410 is deposited so as to over fill the spacer opening 390 (or dummy gate opening 360 in an embodiment of the method that does not include the optional spacers 380). After the high-k material 400 and metal 410 films are deposited they are polished.

Figure 16A:
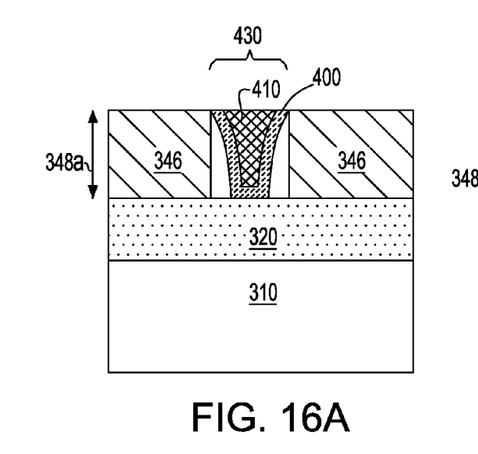
FIG. 16A illustrates a cross section along the y-axis of a substrate with fins after gate CMP. The cross section is taken along a fin running along the y-axis as the fin goes under the gate (i.e., line "A" of FIG. 9).
Figure 16B:
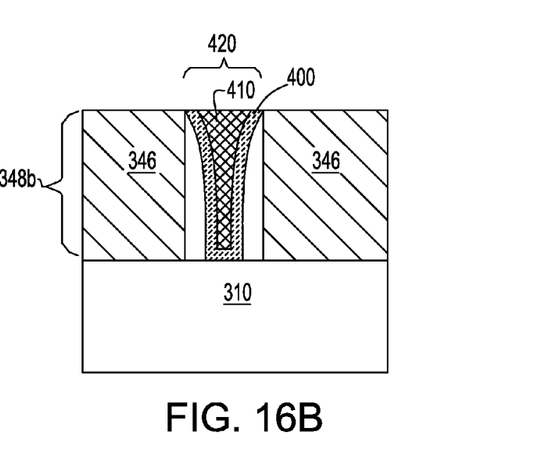
FIG. 16B illustrates a cross section along the y-axis of a substrate with fins after gate CMP. The cross section is taken along the y-axis in an area in which there is only the filled opening (i.e., line "B" of FIG. 9).

Referring to FIGS. 16A and 16B, the high-k material 400 and metal 410 following CMP is illustrated. The films are polished so that the high-k material 400, metal 410 and remaining sacrificial film 346 are co-planar to form a first gate 420 over the isolation area 310 of the substrate (see FIG. 16B) and a second gate 430 over the active area 320 of the substrate (see FIG. 16A). In a non-planar FET, the first gate 420 may have a void in it or, preferably, may be void free. The second gate 430 should be void free.

It should be noted, that in a non-planar FET embodiment, the first gate 420 and the second gate 430 are not discrete structures. Instead, the first and second gates refer to regions along the line of gate stack material (high-k material 400 and metal 410) that runs over the fins and perpendicular to the fins. The first gate 420 is preferably located in the region of the gate stack line over the isolation area 310 of the substrate (FIG. 16B). The second gate 430 is in a region of the gate stack line which is over the active area 320 of the substrate (FIG. 16A).

Figure 17A:
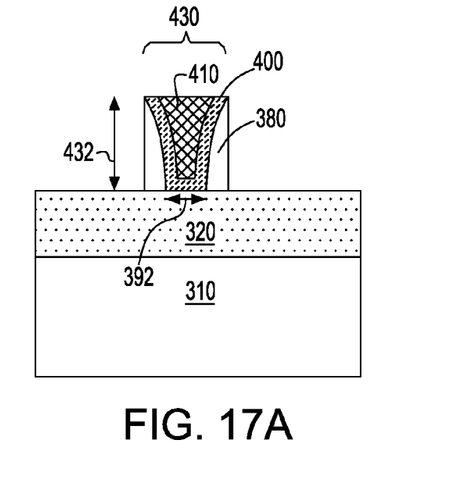
FIG. 17A illustrates a cross section along the y-axis of a substrate with fins showing a second gate over the active area (fin) according to an embodiment of the invention. The cross section is taken along a fin running along the y-axis as the fin goes under the second gate (i.e., line "A" of FIG. 9).
Figure 17B:
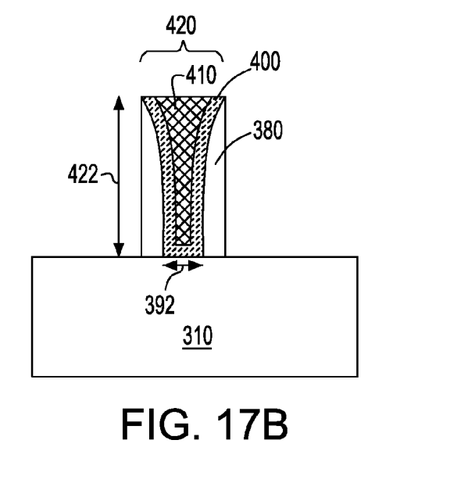
FIG. 17B illustrates a cross section along the y-axis of a substrate with fins showing a first gate over isolation area (box) according to an embodiment of the invention. The cross section is taken along the y-axis in an area in which there is only the gate (i.e., line "B" of FIG. 9).

Referring to FIGS. 17A and 17B, the remaining 246 sacrificial film is removed by RIE. The gates 420 and 430 can now be further described. In the instant application, the term "gate" includes the high-k material 400 and metal 410. The gates, whether first 420 or second 430 have the same width, namely the width 392 of the spacer opening (or width 362 of the dummy gate opening when spacers are absent). The width is measured at the bottom of the gate where the high-k material 400 meets the substrate 300, as opposed to the top of the gate. The width 392 is measured from a first interface of the spacer 380 and high-k material 400 to a second interface of the spacer 380 and high-k material 400. (In the absence of a spacer 380, the width 362 is measured from the outside edges of the high-k material 400). Due to the step height 325 of the substrate 300, the heights of the first gate 420 and second gate 430 are different. The height 422 of the first gate 420 is greater than the height 432 of the second gate 430. The height 422 of the first gate 420 is from about 11 nm to about 480 nm and ranges therebetween and is preferably 30 nm to about 60 nm. The height 432 of the second gate 430 ranges from about 10 nm to about 100 nm and ranges therebetween and preferably between 15 nm to about 25 nm.

From this point onward, formation steps including silicidation and contact formation follow. Thus, this concludes the description of an embodiment of the method of making a gate in of a finFET with a replacement gate process using a sacrificial layer.

An advantage of the method, whether applied to a planar FET or a non-planar FET, is that the height of the opening to be filled by the high-k material and metal gate is determined by the height of the remaining sacrificial film rather than the dummy gate height. Because the height of the remaining sacrificial layer is lower than the height of the dummy gate, the method provides a lower aspect ratio opening to be filled. Low aspect ratio holes are more likely to be void free, thus avoiding performance problems associated with gates with voids.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A method of fabricating a gate in a Field Effect Transistor (FET), comprising:
   providing a substrate with an isolation area, an active area and a step height between the isolation area and the active area;
   forming at least one dummy gate above the isolation area and forming at least one dummy gate above the active area;
   depositing a sacrificial layer;
   exposing a portion of the dummy gates;
   removing the dummy gates, and a portion of the sacrificial layer leaving a remaining portion of the sacrificial layer to create a dummy gate opening above the isolation area and a dummy gate opening above the active area;
   depositing a high dielectric constant (high-k) film and depositing a metal film on the high-k film;
   planarizing the substrate wherein the metal film, the high-k film, and the remaining portion of the sacrificial layer are co-planar to form a first gate over the isolation area and a second gate over the active area; and
   removing the remaining portion of the sacrificial layer.

2. The method of claim 1, further comprising forming a spacer adjacent each of the dummy gate openings wherein forming the spacer modifies each of the dummy gate openings resulting in a first spacer opening over the isolation area having a first spacer opening aspect ratio and a second spacer opening over the active area having a second spacer opening aspect ratio.

3. The method of claim 2, wherein the first spacer opening aspect ratio equals the second spacer opening aspect ratio.

4. The method of claim 1, wherein said planarizing to form the first and second gates results in a void-free second gate.

5. The method of claim 1, wherein said planarizing to form the first and second gates results in a first gate height of the first gate and a second gate height of the second gate, wherein the first gate height exceeds the step height.

6. The method of claim 1, wherein said planarizing to form the first and second gates results in a first aspect ratio of the first gate and a second aspect ratio of the second gate, wherein the second aspect ratio is less than 2.5:1.

7. The method of claim 6, wherein the first aspect ratio of the first gate is greater than the second aspect ratio of the second gate.

8. The method of claim 1, wherein said planarizing to form the first and second gates results in a first gate height of the first gate and a second gate height of the second gate, wherein the first gate height is different than the second gate height.

9. The method of claim 8, wherein the first gate height is greater than the second gate height.

10. The method of claim 1, wherein the FET is a planar FET.

11. The method of claim 1, wherein the FET is a non-planar FET.

12. A method of making a reduced aspect ratio opening in a replacement gate process of making a Field Effect Transistor (FET), the method comprising:
   providing a substrate with a dummy gate;
   depositing a sacrificial layer having a first thickness on a horizontal surface of the substrate and on a horizontal surface of the dummy gate, and a second thickness on a sidewall of the dummy gate;
   exposing a portion of the dummy gate by removing the first thickness of the sacrificial layer on the horizontal surface of the dummy gate; and
   removing the second thickness of the sacrificial layer and the dummy gate to leave a remaining portion of the sacrificial layer on the substrate.

* * * * *